United States Patent
Dimitrov et al.

(10) Patent No.: US 8,755,154 B2
(45) Date of Patent: Jun. 17, 2014

(54) TUNED ANGLED UNIAXIAL ANISOTROPY IN TRILAYER MAGNETIC SENSORS

(75) Inventors: Dimitar Velikov Dimitrov, Edina, MN (US); Mark William Covington, Edina, MN (US); Wonjoon Jung, Eden Prairie, MN (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 13/231,451

(22) Filed: Sep. 13, 2011

(65) Prior Publication Data

US 2013/0065085 A1     Mar. 14, 2013

(51) Int. Cl.
G11B 5/33     (2006.01)
G11B 5/39     (2006.01)

(52) U.S. Cl.
USPC .................................. 360/324.1; 360/324.12

(58) Field of Classification Search
USPC ..................................... 360/324.12
See application file for complete search history.

(56) References Cited

U.S. PATENT DOCUMENTS

| | | | |
|---|---|---|---|
| 5,408,377 A | 4/1995 | Gurney et al. | |
| 5,576,914 A | 11/1996 | Rottmayer et al. | |
| 5,726,841 A | 3/1998 | Tong et al. | |
| 5,764,567 A | 6/1998 | Parkin | |
| 5,978,184 A | 11/1999 | Terunuma | |
| 6,233,172 B1 | 5/2001 | Chen et al. | |
| 6,430,015 B2 | 8/2002 | Ju et al. | |
| 6,667,862 B2* | 12/2003 | Zhu | 360/324.12 |
| 6,700,760 B1 | 3/2004 | Mao | |
| 6,795,280 B1 | 9/2004 | Song et al. | |
| 6,914,759 B2* | 7/2005 | Chen et al. | 360/324 |
| 7,035,062 B1* | 4/2006 | Mao et al. | 360/324.2 |
| 7,061,725 B2 | 6/2006 | Seigler | |
| 7,061,732 B2* | 6/2006 | Yoshikawa et al. | 360/324.12 |
| 7,093,347 B2 | 8/2006 | Nowak et al. | |
| 7,126,201 B2 | 10/2006 | Matsutera et al. | |
| 7,151,654 B1 | 12/2006 | Mao et al. | |
| 7,177,122 B2* | 2/2007 | Hou et al. | 360/324.12 |
| 7,277,262 B2 | 10/2007 | Takagishi et al. | |
| 7,333,304 B2 | 2/2008 | Gill et al. | |

(Continued)

FOREIGN PATENT DOCUMENTS

| | | |
|---|---|---|
| JP | 2002-319112 A | 10/2002 |
| JP | 2004-031719 A | 1/2004 |

(Continued)

OTHER PUBLICATIONS

Aram Amassian, Kate Kaminska, Motofumi Suzuki, Ludvik Martinu and Kevin Robbie, "Onset of shadowing-dominated growth in glancing angle deposition," Applied Physics Letters 91, 2007, pp. 1-3, American Institute of Physics.

(Continued)

Primary Examiner — Wayne Young
Assistant Examiner — Carlos E Garcia
(74) Attorney, Agent, or Firm — Hall Estill Attorneys at Law

(57) ABSTRACT

Various embodiments may be constructed with a trilayer stack that is positioned on an air bearing surface (ABS). The trilayer stack can be configured with a stripe height along an axis orthogonal to the ABS and with first and second magnetic free layers that each has an angled uniaxial anisotropy with respect to the ABS.

20 Claims, 5 Drawing Sheets

(56) References Cited

U.S. PATENT DOCUMENTS

| | | | |
|---|---|---|---|
| 7,369,374 B2* | 5/2008 | Gill et al. | 360/324.12 |
| 7,382,589 B2 | 6/2008 | Lin et al. | |
| 7,804,668 B2 | 9/2010 | Zhou et al. | |
| 7,843,668 B2* | 11/2010 | Machita et al. | 360/319 |
| 7,927,724 B2 | 4/2011 | Nikitin et al. | |
| 2002/0051380 A1 | 5/2002 | Kamiguchi et al. | |
| 2002/0114111 A1 | 8/2002 | Zhu | |
| 2002/0154455 A1 | 10/2002 | Lenssen | |
| 2004/0012895 A1 | 1/2004 | Drewes et al. | |
| 2004/0013880 A1 | 1/2004 | Daughton et al. | |
| 2005/0063100 A1 | 3/2005 | Kautzky et al. | |
| 2006/0245117 A1 | 11/2006 | Nowak et al. | |
| 2009/0154009 A1 | 6/2009 | Le | |
| 2009/0154025 A1* | 6/2009 | Carey et al. | 360/314 |
| 2011/0007426 A1* | 1/2011 | Qiu et al. | 360/313 |

FOREIGN PATENT DOCUMENTS

| | | | |
|---|---|---|---|
| JP | 2004-221303 A | 8/2004 | |
| JP | 2007-200428 A | 8/2007 | |
| JP | 2008-112496 A | 5/2008 | |
| JP | 2011066017 A | 3/2011 | |

OTHER PUBLICATIONS

J. Dufourcq, G. Gay, D. Lafond, P. Mur, G. Molas, J. P. Nieto, L. Vandroux, L. Jodin, F. Gustavo and TH. Baron, "High density platinum nanocrystals for non-volatile memory applications," Applied Physics Letters 92, 2008, pp. 1-3, American Institute of Physics.

Damon B. Farmer and Roy G. Gordon, "High density Ru nanocrystal deposition for nonvolatile memory applications," Journal of Applied Physics 101, 2007, pp. 1-5, American Institute of Physics.

Ralf Hofmann and Nety Krishna, "Self-assembled metallic nanocrystal structures for advanced non-volatile memory applications," Microelectronic Engineering 85, 2008, pp. 1975-1978, Elsevier B. V.

Zengtao Liu, Venkat Narayanan, Gen Pei and Edwin Chihchuan Kan, "Metal Nanocrystal Memories—Part I: Device Design and Fabrication," IEEE Transactions on Electron Devices, Sep. 2002, vol. 49, No. 9, pp. 1606-1613, IEEE.

U. Valbusa, C. Boragno and F. Buatier de Mongeot, "Nanostructuring surfaces by ion sputtering," Journal of Physics Condensed Matter 14, 2002, pp. 8153-8175, IOP Publishing Ltd., UK.

Sung-Soo Yim, Do-Joong Lee, Ki-Su Kim, Moon-Sang Lee, Soo-Hyun Kim and Ki-Bum Kim, "Atomic Layer Deposition of Ru Nanocrystals with a Tunable Density and Size for Charge Storage Memory Device Application," Electrochemical and Solid-State Letters 11, 2008, pp. K89-K92, The Electrochemical Society.

* cited by examiner tion of the present invention. The device 100 includes a substantially
TUNED ANGLED UNIAXIAL ANISOTROPY IN TRILAYER MAGNETIC SENSORS

SUMMARY

A trilayer stack may be positioned on an air bearing surface (ABS). The trilayer stack can be configured with a stripe height along an axis orthogonal to the ABS and with first and second magnetic free layers that each has an angled uniaxial anisotropy with respect to the ABS.

DETAILED DESCRIPTION

Magnetic sensors with enhanced performance through tuned anisotropy are generally disclosed herein. As industry progresses towards reduced form factor data storage devices, demand for larger data capacity and faster data transfer rates increases, which may correspond with smaller magnetic sensor components, such as magnetic shields and data sensing layers. Reduced magnetic component sizes can degrade performance of a data storage device by increasing magnetic instability while reducing the accuracy of sensed data bits. Thus, construction of reduced form factor magnetic sensors that can maintain precise shielding characteristics and enhanced data transfer rates is in increasing demand in the industry.

Accordingly, a magnetic sensor can be constructed with a magnetically responsive trilayer stack having a stripe height and positioned on an air bearing surface (ABS). The trilayer stack may have two or more magnetic free layers that each has an angled uniaxial anisotropy with respect to the ABS. Such angled uniaxial anisotropy may allow for greater sensor accuracy with increased signal amplitude and reduce susceptibility to process and design sensitivity. The angled anisotropic layers may further be tuned for enhanced data read performance with minimal increase in sensor thickness as anisotropy angles are optimized to accommodate various environmental and operational characteristics.

By orienting the anisotropy of the layers of the trilayer stack, the magnetic stability of a magnetic sensor can be enhanced, especially in reduced form factor data storage devices. The angled anisotropy can further increase operational characteristics of the trilayer read element by improving readback performance by elevating magnetic yield, which may correspond to larger sensed magnetic field and signal amplitude.

Figure 1:
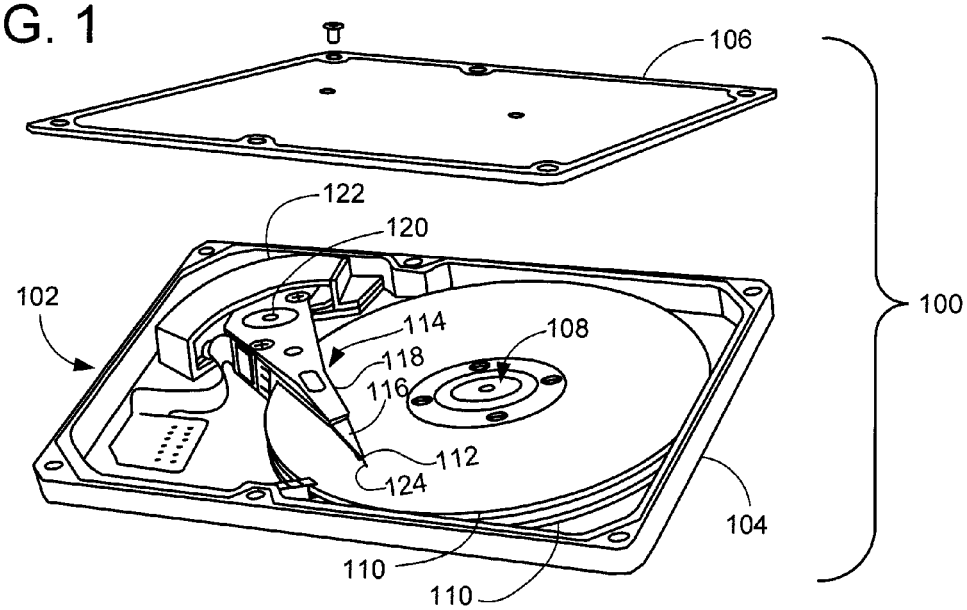
FIG. 1 is a perspective view of an example data storage device.

Turning to the drawings, FIG. 1 shows an embodiment of an example data storage device 100 in a non-limiting environment in which various embodiments of the present invention can be practiced. The device 100 includes a substantially sealed housing 102 formed from a base deck 104 and top cover 106. An internally disposed spindle motor 108 is configured to rotate a number of magnetic storage media 110. The media 110 are accessed by a corresponding array of data transducers (read/write heads) that are each supported by a head gimbal assembly (HGA) 112.

Each HGA 112 can be supported by a head-stack assembly 114 ("actuator") that includes a flexible suspension 116, which in turn is supported by a rigid actuator arm 118. The actuator 114 may pivot about a cartridge bearing assembly 120 through application of current to a voice coil motor (VCM) 122. In this way, controlled operation of the VCM 122 causes the transducers (numerically denoted at 124) to align with tracks (not shown) defined on the media surfaces to store data thereto or retrieve data therefrom.

Figure 2A:
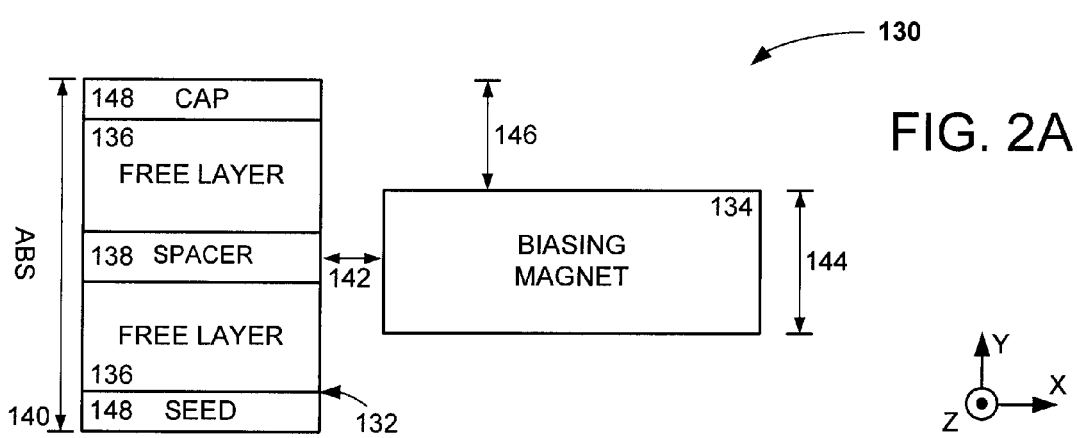
FIG. 2 shows cross-section and top views of an example magnetic sensor capable of being used in various embodiments.

FIG. 2 generally illustrates cross-section and top views of block representations of various embodiments of a magnetic sensor 130 capable of being used in the data storage device of FIG. 1. The sensor 130 can be constructed, as shown in FIG. 2A, with a magnetic stack 132 positioned on an air bearing surface (ABS) and disposed between the ABS and a rear biasing magnet 134. While unlimited in both structural and operational configurations, the stack 132 may have a pair of magnetically free layers 136 separated by a non-magnetic spacer 138, which can be characterized as a trilayer read element due to the three operational layers and the lack of any pinning magnetic layers included in the stack 132 itself.

The use of a trilayer read element configuration can provide reduced shield-to-shield spacing 140, especially in high linear density data storage devices, as the rear biasing magnet 134 provides set magnetization to the free layers 136 to allow data bits to be sensed without adding to the stack's size. Placement of the rear biasing magnet 134 further allows for tuning of the size and position to optimize performance of the stack 132. For example, the biasing magnet 134 can be formed a biasing distance 142 from the stack 132 and with a biasing thickness 144 that provides a decoupling distance 146, that may be filled with insulating material, from any magnetic shields included in the magnetic sensor 130.

Inclusion of magnetic shields (not shown) to the magnetic sensor 130 can be separated from the magnetic stack 132 with one or more decoupling layers 148, such as cap and seed layers, that may be tuned with any number of layers and materials that isolate magnetization transfer between the stack 132 and any shields. The sensor 130 may be further tuned for optimized performance by adjusting the dimensions and magnetizations of the stack 132 and biasing magnet 134, as displayed in top view of FIG. 2B.

While a biasing magnet thickness 144 that is focused about the spacer layer 138 may provide enhanced magnetic influence on the stack 132, the respective stack and biasing magnet widths 150 and 152, as measured parallel to the ABS along the Z axis, can be tuned to be similar or dissimilar to correspond to respective stack and biasing magnet stripe heights 154 and 156. The width and stripe heights of the stack 132 and biasing magnet 134 can be minutely tuned to provide a $M_{PM}$ magnetization of predetermined strength and angular orientation that influences the respective magnetic free layers 136 of the stack 132 to predetermined set magnetizations, $M_{FL1}$ and $M_{FL2}$.

As such, the various dimensions, thicknesses, and magnetic orientations of the stack 132 and biasing magnet 134 can allow for precise tuning to accommodate any number of predetermined operational and environmental conditions while maintaining a reduced form factor. However, process and design variability may increase magnetic sensitivity that endangers accurate data sensing.

Figure 3:
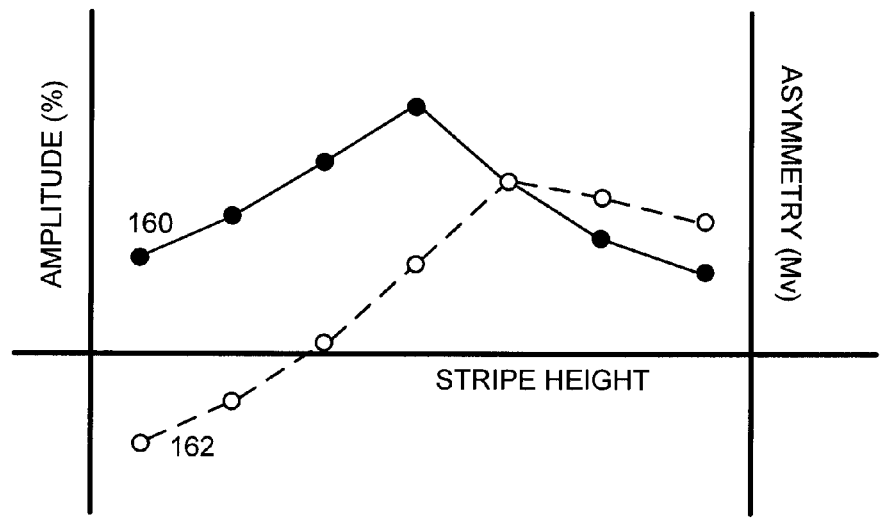
FIG. 3 plots example operation of a magnetic sensor constructed and operated in accordance with various embodiments of the present invention.

FIG. 3 provides example operational characteristics of an example magnetic sensor with respect to the magnetic stack's stripe height. Solid line 160 plots data signal amplitude that increases as stripe height increases until a pinnacle point, then decreases rapidly. Similar, but unique behavior is displayed by segmented line 162 that corresponds to magnetic stack asymmetry, which increases to an intermediate stripe height and subsequently decreases.

Figure 2B:
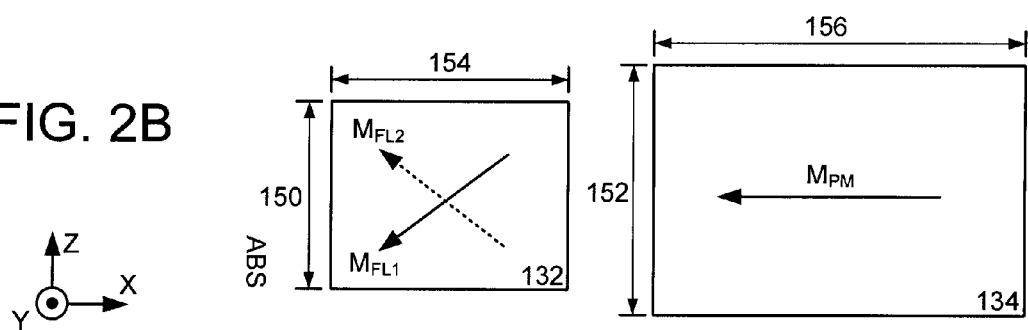

It can be appreciated that the dimensions of a sensor stack, particularly a trilayer read element stack, can be tuned to a wide variety of operational behaviors with merely the adjustment of the stack stripe height, such as height 154 of FIG. 2B. While a relatively large stripe height can be utilized to provide optimized data sensing in certain situations, line 162 illustrates how asymmetry can be a potential susceptibility of such a magnetic sensor. Therefore, various embodiments herein tune magnetic sensors with a reduced stripe height stack that decreases process complexity and magnetic sensitivity to process parameters while enhancing data readback signal amplitude.

In some embodiments, a relatively short stack stripe height is configured with varying uniaxial anisotropies that are tuned for orientation and strength to provide enhanced data sensing performance. Such varying uniaxial anisotropies may be constructed in various unlimited manners, such as oblique deposition, that allows for anisotropic angles to be precisely set and maintained.

Figure 4A:
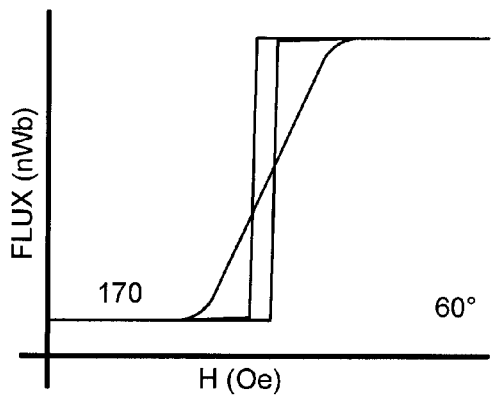
FIGS. 4A-4C generally illustrate example hysteresis loops for various magnetically free layer capable of being used in magnetic sensors according to various embodiments.
Figure 4B:
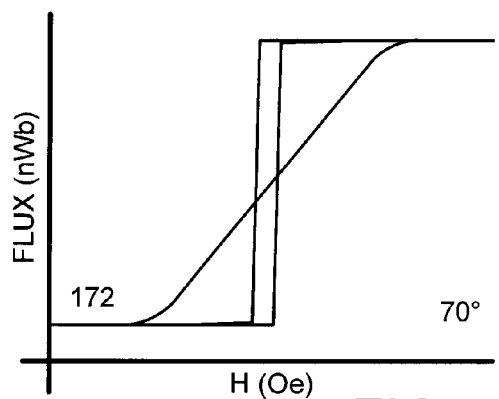
Figure 4C:
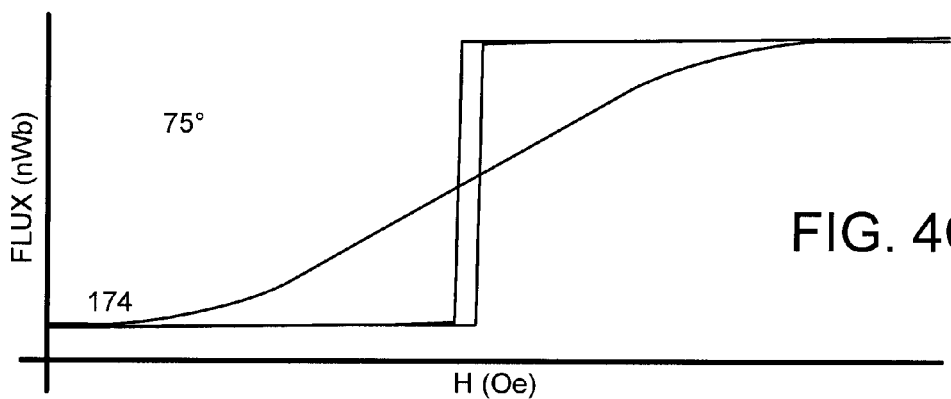

FIGS. 4A-4C respectively graph example hysteresis loops for magnetically free layers with different magnetization anisotropies formed with oblique deposition of varying angles. FIG. 4A displays loop 170 corresponding to a magnetically free layer formed, at least partially, by oblique deposition at 60°, which can result in an anisotropic strength of approximately 100 Oe. In comparison, loop 172 of FIG. 4B, deposited with a 70° angle, has approximately a 300 Oe anisotropic strength along with an increased transition region between free layer magnetic saturations.

With a deposition angle of 75°, as shown by loop 174 in FIG. 4C, anisotropic strength and transition region characteristics increase to approximately 1000 Oe and a 2000 Oe transition between magnetic saturations. The construction of a relatively short magnetic stack stripe height, such as a height that is less than twice the stack width (150 of FIG. 2B), can exhibit optimized performance when anisotropic strength is between roughly 600-1000 Oe, which may be procured by depositing at least one free layer at angles in the proximity of 75°.

Figure 5A:
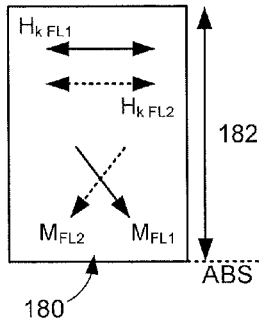
FIGS. 5A-5C provide example magnetic stacks capable of being used in magnetic sensors according to various embodiments.
Figure 5B:
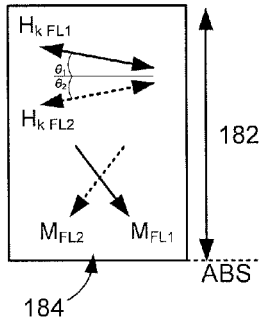
Figure 5C:
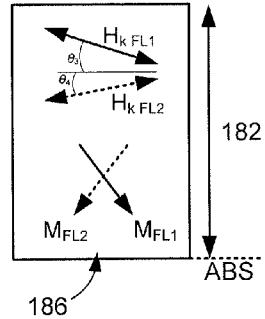

While not limiting, such deposition angle can be formed by controlled-incidence sputtering (CIS) where flux passes through a shutter window onto a rotating sample while both shutter and sample sweeps laterally in parallel planes. CIS can be used to precisely deposit particles with a mean angle of incidence that can form predetermined uniaxial anisotropies. With the variety of uniaxial anisotropy strengths that may be provided by forming at least one free layer with oblique deposition, further tuning and optimization can be achieved by canting the angle of one or more uniaxial anisotropies with respect to the ABS. FIGS. 5A-5C generally illustrate top views of various example magnetic stacks tuned with a variety of uniaxial anisotropies in accordance with various embodiments. FIG. 5A provides magnetic stack 180 with magnetization anisotropies, $H_{K\,FL1}$ and $H_{K\,FL2}$, that are each substantially parallel to the ABS and default magnetizations, $M_{FL1}$ and $M_{FL2}$, set at predetermined angles by a biasing magnet (not shown).

The angle of the uniaxial anisotropies for the free layers of stack 180 can be tuned in relation to a predetermined stripe height 182, such as 39 nm, to optimize the process and design sensitivity of the stack 180 while enhancing data signal amplitude. The uniaxial anisotropies and stack stripe height 182 can be further tuned for magnitude and cant angle to precisely control performance of the stack 180 while maintaining a reduced form factor.

FIG. 5B illustrates magnetic stack 184 that has magnetizations similar to that of FIG. 5A, but cants each uniaxial anisotropy with respective angles, $\theta_1$ and $\theta_2$, in relation to the ABS. The angle orientations of the uniaxial anisotropies in stack 184 are not required or limited and can be modified, at will, to optimize performance. For example, the anisotropy angles can be complimentary angles or set to predetermined similar angles, such as 10°.

FIG. 5C shows another example magnetic stack 186 that has uniaxial anisotropies set at unique angles, such as 10° for $\theta_3$ and 15° for $\theta_4$. The ability to adjust and tune the performance of the magnetic stack 186 by choosing the angles of the uniaxial anisotropies may correspond to reduced operational asymmetry between the magnetically free layers of the stack 186. The selection of uniaxial anisotropy angles can further be selected and tuned in relation to the thickness of the rear biasing magnet, such as magnet 134 of FIG. 2A. That is, the angle and strength of the uniaxial anisotropies may be selected to correspond to a reduced biasing magnet thickness that can allow the anisotropy to fully enhance readback signal amplitude and design sensitivity.

Figure 6A:
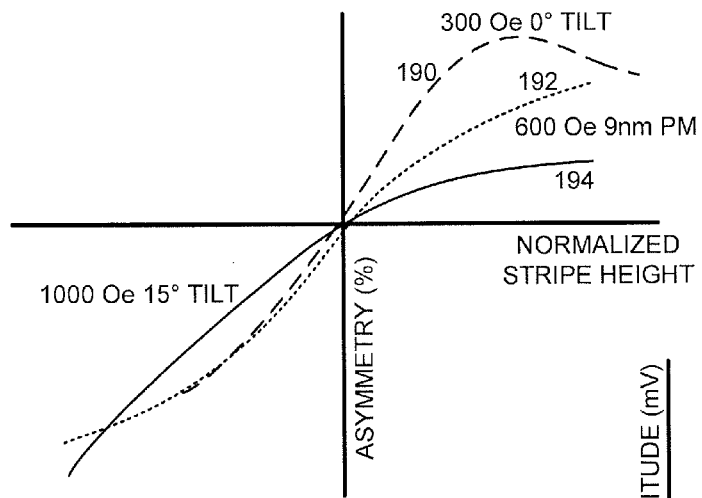
FIGS. 6A and 6B graph operational characteristics of various embodiments of example magnetically free layers capable of being used in various embodiments.
Figure 6B:
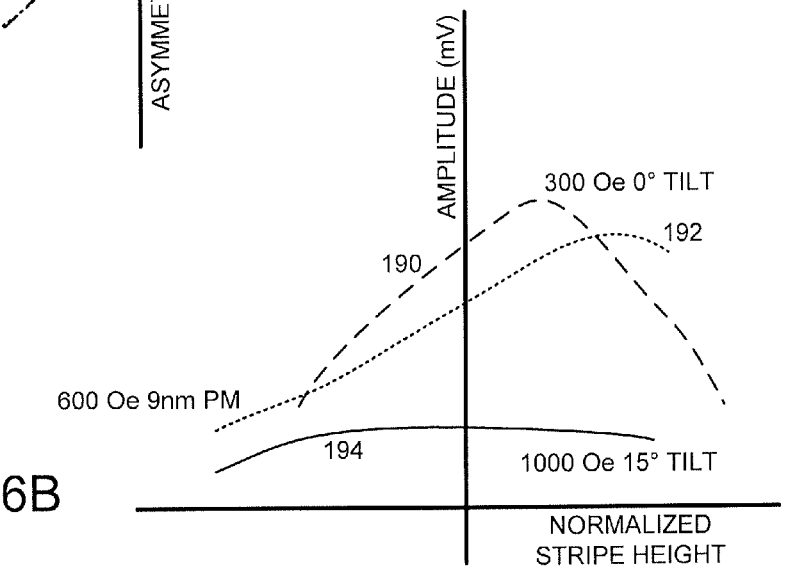

FIGS. 6A and 6B plot magnetization asymmetry and signal amplitude for various tuned configurations of a magnetic stack. One such configuration is represented by segmented line 190, which maps a magnetic free layer with uniaxial anisotropy with a 300 Oe strength and no cant with respect to the ABS. Such an anisotropic configuration may result in elevated magnetization asymmetry and signal amplitude for various stripe heights while providing reduced signal amplitude in other stripe heights.

A more conservative magnetically free layer configuration, displayed by segmented line 192, can have a 600 Oe, no cant, and an anisotropic strength corresponding to a biasing magnet (PM) with a 9 nm thickness, like thickness 144 of FIG. 2A. As shown, the magnetization asymmetry and signal amplitude are reduced compared to the reduced anisotropic strength of line 192.

Solid line 194 illustrates how a 1000 Oe anisotropic strength and 15° cant can enhance performance for both magnetization asymmetry and signal amplitude for a majority of stripe heights. The reduced asymmetry and signal amplitude volatility can provide enhanced data sensing while being more resilient to design and process variability. The variety of operational characteristics can allow for the tuning and optimization of a magnetic stack with free layers having different uniaxial anisotropic characteristics, such as anisotropic strength and cant angle.

Figure 7A:
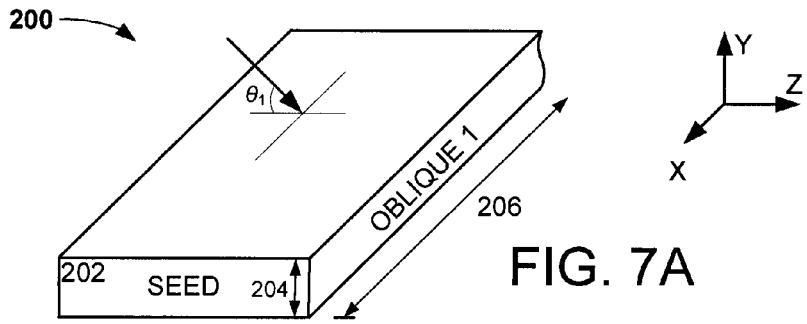
FIGS. 7A-7D display example magnetic sensor configurations in accordance with various embodiments of the present invention.

FIGS. 7A-7D generally display isometric views of an example manufacture for various structural configurations capable of being used in various magnetic sensors to tune and optimize data sensing performance. FIG. 7A shows magnetic sensor 200 with a decoupling seed layer 202 formed with a first thickness 204 and a first stripe height 206 by an oblique deposition process that deposits the seed layer material, such as Ru and Ta, at a first angle $\theta_1$ with respect to the Z axis.

Figure 7B:
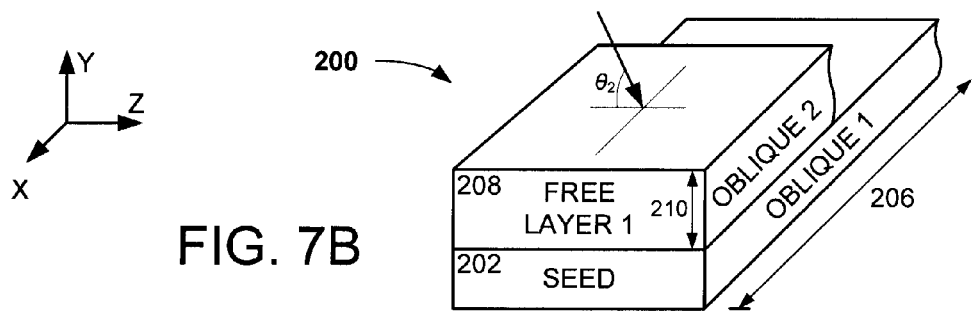
Figure 7C:
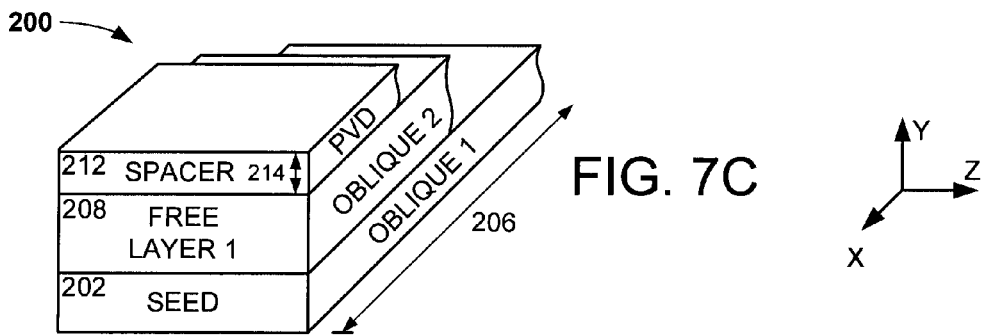

The decoupling seed layer 202 can be subsequently used as a substrate to directly couple a first magnetically free layer 208 onto, as displayed in FIG. 7B. The free layer 208 can have a second thickness 210 and an unlimited stripe height that may or may not match the stripe height 206 when formed by oblique deposition from a second angle $\theta_2$ with respect to the Z axis. FIG. 7C shows a non-magnetic spacer layer 212 can then be formed atop the first magnetically free layer 208 with a predetermined thickness 214, material, such as MgO, and stripe height. It should be noted that the non-magnetic nature of the spacer layer 212 may correspond to any deposition technique, such as physical vapor deposition, chemical vapor deposition, and sputtering.

Figure 7D:
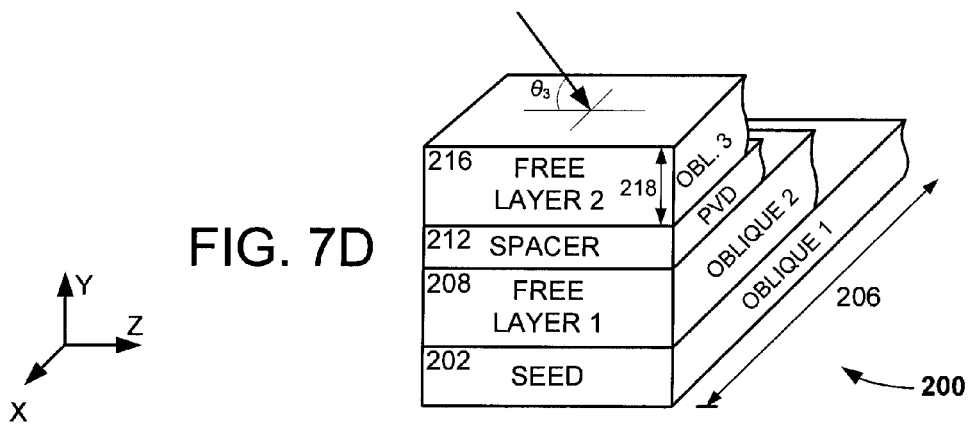

FIG. 7D displays how a second magnetically free layer 216 can be formed onto the spacer layer 212 with oblique deposition from a third angle $\theta_3$ that results in a predetermined uniaxial anisotropy, layer thickness 218, and unlimited stripe height distance. While additional layers, such as a decoupling cap layer, may be further included into the magnetic sensor 200, FIGS. 7A-7D illustrate the variety of materials, deposition techniques, stripe heights, and thicknesses that can be individually or collectively tuned to provide predetermined data sensing performance.

It should be noted that the various magnetic sensor configurations of FIGS. 7A-7D are merely examples and are in no way limiting or restricting. In fact, the configurations of varying magnetically free layers 208 and 216 may be uniquely tuned to any number of uniaxial anisotropies that can correspond, as discussed above, to reduced stripe heights, thin rear biasing magnets, and canted anisotropies, which can accommodate operational environments, such as reduced form factor and increased data transfer rate data storage devices.

Figure 8:
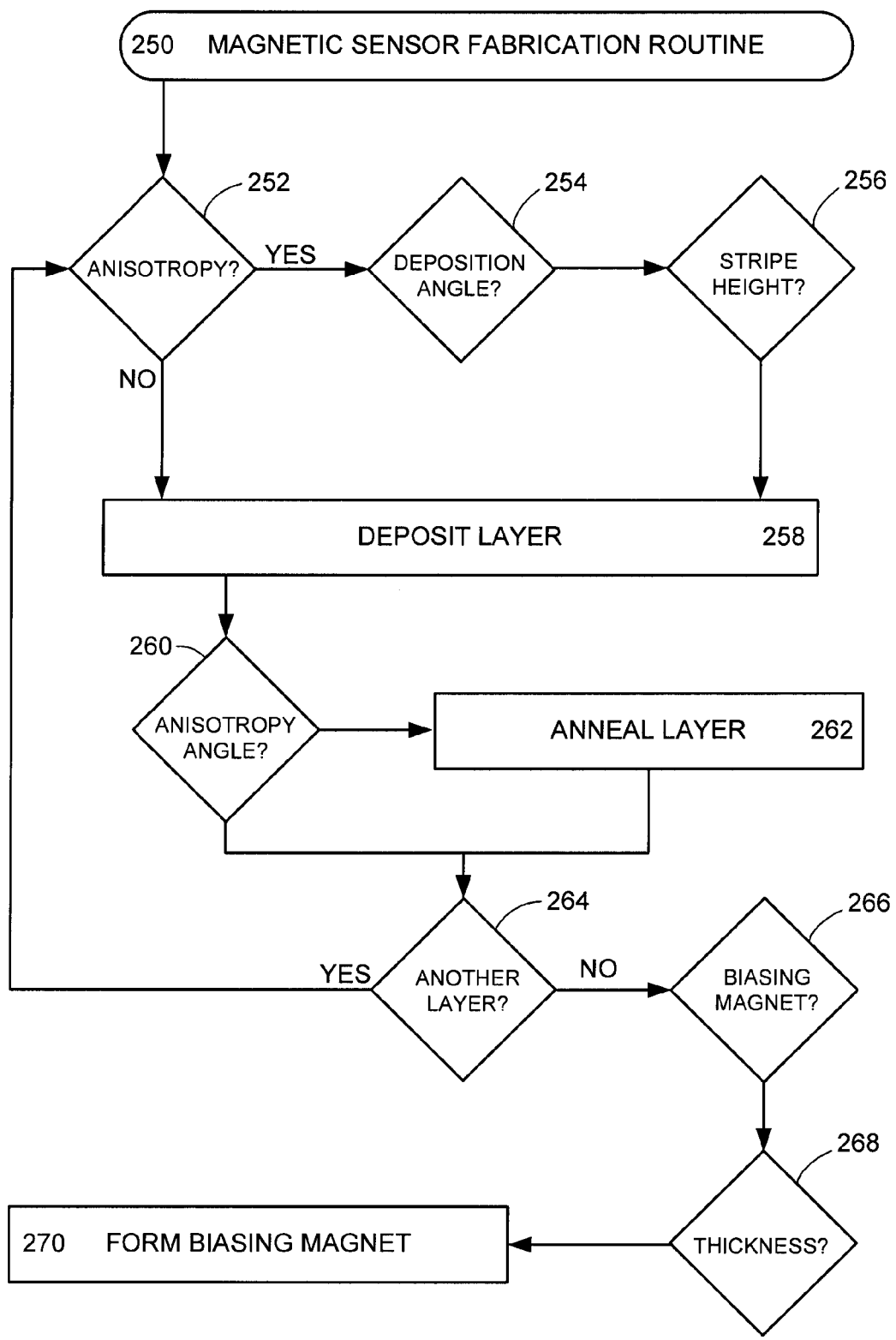
FIG. 8 provides a flowchart of a magnetic sensor fabrication routine carried out in accordance with various embodiments of the present invention.

FIG. 8 provides an example flowchart of a sensor fabrication routine 250 conducted in accordance with various embodiments of the present invention. Initially, the routine 250 determines in decision 252 if an anisotropic layer is to be the bottom layer of the magnetic sensor. While not required or limited, a magnetic shield or decoupling layer, such as seed layer 202 of FIG. 7A, can be formed with or without magnetization anisotropy depending on the predetermined operation of the magnetic sensor.

If an anisotropic layer is to be formed, decision 252 advances to decision 254 where the oblique deposition angle is evaluated. As discussed in relation to FIGS. 4A-4C, an oblique deposition angle may directly correspond to the uniaxial anisotropy of the resultant layer. However, it is to be understood that oblique deposition is not the only manner in which uniaxial anisotropy can be constructed. Establishment of the deposition angle, decision 256 then determines the stripe height of the layer, which can affect the strength and operational behavior of the corresponding uniaxial anisotropy, as illustrated in FIGS. 6a and 6B.

With the uniaxial magnetization anisotropy either determined in decisions 254 and 256, or if no anisotropy is chosen in decision 252, block 258 next deposits the layer to conform to the predetermined specifications. The uniaxial anisotropy can further undergo tuning and modification by varying the angle of the anisotropy with respect to an air bearing surface (ABS), which is evaluated in decision 260. While not required or limited, in some embodiments, the anisotropy is canted by annealing the anisotropic layer in block 262.

Such annealing can increase the anisotropic strength of the layer while rotating the axis of the anisotropy depending on the direction of annealing with respect to the anisotropy. That is, annealing a layer parallel or orthogonal to the easy axis parallel to the anisotropy may produce minimal rotation while annealing roughly 45 degrees with respect to the easy axis can rotate the anisotropy, which can be repeated an unlimited number of times to provide anisotropy canted at an angle determined in decision 260.

The formation of the layer either from block 258 or block 262 then proceeds to evaluate in decision 264 if another layer is to be formed in the magnetic sensor. If so, the routine 250 returns to decision 252 where another layer is formed that may or may not have uniaxial anisotropy. In the event decision 264 determines no other layers are to be included in the magnetic stack, decision 266 evaluates if a biasing magnet is to be installed into the sensor, to which decision 268 then determines the thickness of the biasing magnet to be formed by block 270.

It can be appreciated that a wide variety of magnetic sensors can be constructed from the routine 250 that exhibit various structural and operational characteristics, such as shortened stripe heights and varying uniaxial anisotropies between magnetically free layers. The routine 250, however, is not limited only to the blocks and decisions provided in FIG. 8 as any number of blocks and determinations can be added, omitted, and modified to accommodate the fabrication of a precisely tuned magnetic sensor that utilizes uniaxial anisotropy to provide enhanced magnetic sensing with reduced sensitivity to design and process variability.

The various configurations and material characteristics of the magnetic sensor described in the present disclosure may allow for enhanced data reading performance while maintaining a reduced form factor due to the use of varying uniaxial anisotropies in each magnetically free layer. Each free layer can be tuned and optimized in relation to each other to provide uniaxial anisotropies of different strengths and orientations that may correspond to increased magnetic stability as sensitivity to design and process variability is reduced. Moreover, data signal amplitude may be increased as the tuned uniaxial magnetization anisotropies can operate in reduced stripe height stacks that exhibit low magnetization asymmetry. In addition, while the embodiments have been directed to magnetic sensing, it will be appreciated that the claimed invention can readily be utilized in any number of other applications, including data storage device applications.

It is to be understood that even though numerous characteristics and configurations of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed. For example, the particular elements may vary depending on the particular application without departing from the spirit and scope of the present invention.

What is claimed is:

1. An apparatus comprising a trilayer stack positioned on an air bearing surface (ABS) and configured with first and second magnetic free layers that each has an angled uniaxial anisotropy with respect to the ABS without any pinning magnetic layers contacting the first or second magnetic free layers between leading and trailing shields.

2. The apparatus of claim 1, further comprising a biasing magnet positioned adjacent the trilayer stack distal to the ABS, the biasing magnet configured with a biasing length along the axis orthogonal to the ABS, the biasing length being greater than a stripe height.

3. The apparatus of claim 1, wherein the angled uniaxial anisotropy of each magnetic free layer has a different magnitude.

4. The apparatus of claim 1, wherein the angled uniaxial anisotropy of the first magnetic free layer is tilted 15 degrees.

5. The apparatus of claim 1, wherein the angled uniaxial anisotropy of the second magnetic free layer is tilted 15 degrees.

6. The apparatus of claim 1, wherein the angled uniaxial anisotropy of the first magnetic free layer is tilted 10 degrees.

7. The apparatus of claim 1, wherein the angled uniaxial anisotropy of each magnetic free layer is the same.

8. The apparatus of claim 1, wherein the trilayer stack has a stripe height along an axis orthogonal to the ABS, the stripe height is greater that a stack width of the trilayer stack, measured at the ABS, and smaller than twice the stack width.

9. The apparatus of claim 1, wherein the angled uniaxial anisotropy of at least one magnetic free layer is 1000 Oe.

10. The apparatus of claim 1, wherein the angled uniaxial anisotropy is substantially in a cross-track direction across each magnetic free layer.

11. The apparatus of claim 1, wherein the first and second magnetic free layers are separated by a non-magnetic spacer layer.

12. A method comprising:
positioning a trilayer stack on an air bearing surface (ABS), the trilayer stack having a stripe height along an axis orthogonal to the ABS; and
configuring first and second magnetic free layers of the trilayer stack with an angled uniaxial anisotropy with respect to the ABS without any pinning magnetic layers contacting the first or second magnetic free layers between leading and trailing shields.

13. The method of claim 12, wherein the angled uniaxial anisotropy of each free layer is respectively formed with static oblique deposition from first and second angles.

14. The method of claim 13, wherein the second angle is selected with respect to the angled uniaxial anisotropy of the first magnetic free layer to provide a predetermined tunneling magnetoresistive ratio in response to an external data bit.

15. The method of claim 12, wherein at least one magnetic free layer is annealed to shift an angle uniaxial anisotropy to a predetermined angular orientation.

16. A sensor comprising a trilayer stack biased to a predetermined default magnetization by a biasing magnet, the trilayer stack having a stripe height along a bias axis orthogonal to an air bearing surface (ABS) that is less than a biasing length of the biasing magnet along the bias axis, the trilayer stack configured with first and second magnetic free layers that each has uniaxial anisotropy angled at different, non-orthogonal angles with respect to the ABS without any pinning magnetic layers contacting the first or second magnetic free layers between leading and trailing shields.

17. The sensor of claim 16, wherein a first thickness measured from the first magnetic free layer to the second magnetic free layer along an ABS axis, parallel the ABS, is greater than a second thickness of the biasing magnet along the ABS axis.

18. The sensor of claim 17, wherein the biasing magnet is aligned with a non-magnetic spacer disposed between the first and second magnetic free layers.

19. The sensor of claim 16, wherein the biasing magnet is configured to set the first and second magnetic free layer to a default magnetization.

20. The sensor of claim 16, wherein the different angles of the uniaxial anisotropy of each magnetic free layer are complementary angles.

* * * * *